MICROWAVE HYBRID TUBE APPARATUS

Filed Dec. 30, 1963 2 Sheets-Sheet 1

INVENTORS
RODNEY R. RUBERT
ROBERT L. PERRY
BY Harry E. Aine
ATTORNEY

INVENTORS
RODNEY R. RUBERT
ROBERT L. PERRY
BY Harry E. Aine
ATTORNEY 3,289,032

MICROWAVE HYBRID TUBE APPARATUS

Rodney R. Rubert, Santa Clara, and Robert L. Perry, San Jose, Calif., assignors to Varian Associates, Palo Alto, Calif., a corporation of California Filed Dec. 30, 1963, Ser. No. 334,496
13 Claims. (Cl. 315—3.6)

The present invention relates in general to microwave hybrid amplifier tube apparatus and more specifically to a novel microwave amplifier utilizing a stagger tuned klystron buncher section followed by a traveling wave tube section to provide more uniform gain over a broad band of frequency at high efficiency. Such broadband amplifier tubes are especially useful in frequency agile radars, in broadband transmission systems and the like.

Heretofore broadband amplifier tubes have been constructed to yield approximately 6% bandwidth of uniform power output between 1 db points at substantial power levels in the order of megawatts. Such prior tubes have been generally unsatisfactory because they generally lack uniform gain characteristics over this bandwidth. Therefore, in order to achieve the uniform power output, the signal generator providing the signal to be amplified had to have a compensating power output characteristic to provide increased power output at its band edges, such increased power output being in the order of 5 to 10 db more than the power output in the center of the band. Generally this increased band edge power output characteristic was achieved by the use of a filter between signal generator and the amplifier tube which filter was relatively expensive.

It has heretofore been proposed to provide a hybrid microwave amplifier tube having a stagger tuned multicavity driver section followed by a traveling wave tube final section. Such a tube is reported in the Proceedings of the I.R.E., February 1960, page 263, in an article titled "On the Performance of a Class of Hybrid Tubes," by S. V. Yakavalli. This prior art tube was not successful in providing broadband operation as the gain characteristics were quite non-uniform and provided only about 0.5% bandwidth between 1 db points in the gain characteristic and at only 17% efficiency. Such a narrow band gain characteristic is inferior to that obtainable from conventional broadband klystrons and traveling wave tubes.

In the present invention a hybrid microwave amplifier tube is provided which includes a multicavity stagger tuned klystron driver section followed by a broadband traveling wave tube section. The multicavity stagger tuned driver section has a gain characteristic with gain deviations over the band supplementing the gain deviation of the traveling wave tube section such that the composite gain characteristic for the entire tube is quite uniform over a relatively wide band of frequencies. For example, the gain characteristic is flat to 1 db over ±6% frequency deviation from the center frequency of the passband of the tube. In a preferred embodiment the gain passband of the stagger tuned driver section is broader than the gain passband of the traveling wave tube section and the cavities of the driver section are tuned and loaded in such a manner as to peak up the driver gain response at the band edges. This novel tube also has greatly enhanced and unexpected maximum efficiency of 48%.

The principal object of the present invention is to provide a microwave amplifier tube having uniform gain characteristics with high efficiency over a relatively wide band of frequencies.

One feature of the present invention is the provision of a hybrid tube apparatus comprising a stagger tuned klystron driver section followed by a traveling wave tube section, the gain characteristics of the klystron section being supplementary to the gain characteristics of the traveling wave tube section, whereby the total gain characteristics of the tube are made more uniform than that of the traveling wave tube section alone over the passband of the tube.

Another feature of the present invention is the same as the preceding feature wherein the gain passband of the multicavity driver section exceeds the gain passband of the traveling wave tube section.

Another feature of the present invention is the same as the preceding feature wherein the traveling wave tube section is a negative mutually inductive coupled slow wave circuit having a forward wave fundamental space harmonic mode of operation with the beam whereby uniform gain characteristics are achieved at relatively high efficiencies.

Another feature of the present invention is the same as the first feature wherein the loaded Q's of the cavities in the multicavity stagger tuned driver section are less than 200 whereby the driver section gain characteristic is especially broadbanded to yield more uniform gain characteristics for the composite tubes.

Other features and advantages of the present invention will become more apparent upon a perusal of the following specification taken in connection with the accompanying drawings wherein.

Figures 1, 4, 5, 6:
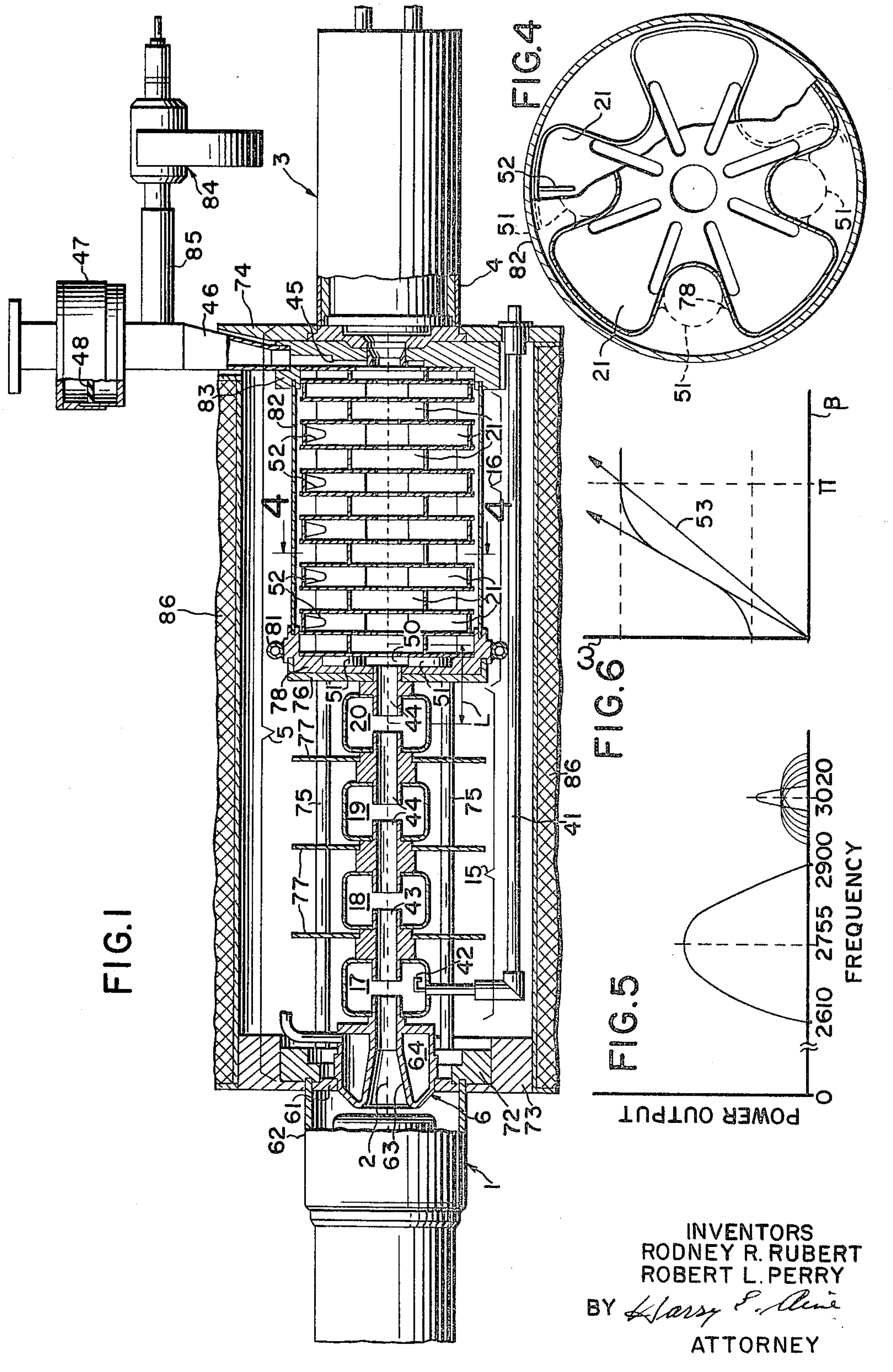
FIG. 1 is a longitudinal cross-sectional view partly in elevation of a hybrid amplifier tube apparatus employing features of the present invention.
FIG. 4 is an enlarged cross-sectional view of a portion of the structure of FIG. 1 taken along lines 4—4 in the direction of the arrows.
FIG. 5 is a graph of power output versus frequency depicting the passband characteristics of the prior art tube.
FIG. 6 is a graph of frequency, $\omega$, versus phase shift per section, $\beta$, for the cloverleaf slow wave circuit utilized in the present invention.

Referring to FIG. 1 there is shown in longitudinal cross-section the hybrid tube apparatus of the present invention. More particularly, the tube includes a conventional electron gun assembly 1, as described in U.S. Patent 2,944,187, issued July 5, 1960, inventor R. L. Walter et al. The electron gun serves to form and project a stream of electrons over an elongated beam path 2 directed axially of the tube. A collector assembly 3 is disposed at the opposite end of the beam path 2 for terminating the beam and for dissipating the energy thereof. The collector is of the conventional design described in U.S. Patent 3,054,925, issued September 18, 1962, inventor R. L. Walter et al. and includes an X-ray shield 4 as described in U.S. patent application Serial No. 56,415, filed September 16, 1960, inventor John A. Ruetz et al., for shielding operating personnel from the X-rays generated within the collector 3. A main body section 5 is disposed inbetween the electron gun 1 and the collector 3.

The main body section 5 includes an anode electrode 6 for accelerating the electrons drawn from the electron gun 1 to beam voltage in the order of 120–140 kv.

The main tube body 5 includes a klystron buncher section 15 followed by a traveling wave tube section 16.

The klystron buncher section 15 includes a plurality of reentrant cavity resonators 17, 18, 19 and 20 successively arranged along the beam path in the conventional klystron manner. The traveling wave tube section 16 includes 13 successive sections 21 of a conventional cloverleaf slow wave circuit of the type described in U.S. patent application Serial No. 7,481, filed September 8, 1960 as a continuation of Serial No. 536,597, now abandoned, filed September 26, 1955, inventor Marvin Chodorow. The cloverleaf traveling wave tube section provides a fundamental forward wave space harmonic for operation with the electron beam as bunched by the klystron driver section 15 to produce amplification of signal energy put on the beam by the klystron driver over a relatively wide band of frequencies.

Figure 2:
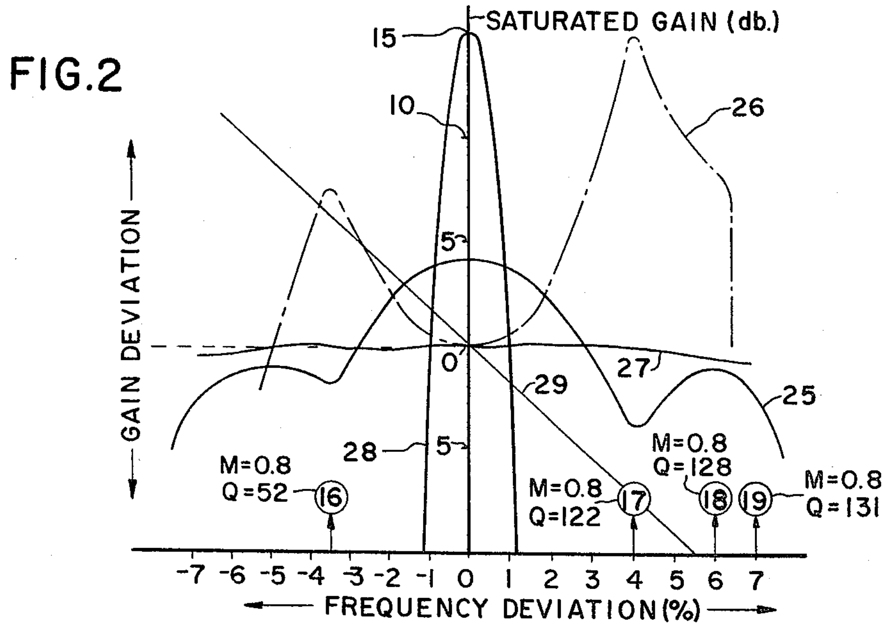
FIG. 2 is a graph of gain deviation versus frequency deviation showing the gain characteristics of the hybrid tube apparatus of the present invention as compared with gain characteristics of the prior art.

The gain characteristic of the multicavity stagger tuned klystron driver section 15 is arranged such that it supplements the gain characteristic of the traveling wave tube section 16. In a preferred embodiment of the present invention the traveling wave tube section 16 is a negative mutually inductively coupled circuit such as, for example, a cloverleaf section as shown in FIG. 1 and has a gain characteristic as shown in FIG. 2 by curve 25. More specifically it can be seen that the small signal gain characteristic 25 of the cloverleaf section begins to rapidly fall off for a frequency deviation out from the center frequency of the band greater than 2%. Thus of one is to obtain uniform gain characteristic over a wider band of frequencies the gain in the band edges must be increased. Accordingly, the small signal gain characteristic of the multicavity driver section 15 is shown as line 26 in FIG. 2 and is arranged to supplement the gain of the traveling wave tube section 16.

The cavities 17–20 are tuned to frequencies as indicated by the arrows at the bottom of the graph and are heavily loaded, preferably by beam loading, to loaded Q's as indicated less than 200 and coupled to the beam with coupling coefficients of $M=0.8$ as indicated to provide supplementary gain deviation at the band edges of the gain characteristic 26 of the traveling wave tube section 16. The gain characteristic curves 25 and 26 for the multicavity driver section and the traveling wave tube section 15 and 16, respectively, are the small signal gain characteristics which are more susceptible to calculation than are the large signal gain characteristics which latter characteristic more truly represent the gain characteristics of the tube under normal operating conditions. However, the small signal gain characteristics are generally indicative of the large signal gain characteristics except that the large signal gain characteristics have less pronounced deviations from a norm, such as the average, than the small gain characteristics. In other words, a large signal characteristic can be approximated by rounding and tending to level out the humps and dips in the small signal gain characteristic curve.

The total large signal gain characteristic of the hybrid tube apparatus of FIG. 1 is shown as line 27 of FIG. 2. This total gain characteristic for the tube shows that the gain response is substantially uniform over a band of 10% at the operating frequency of the tube. This uniform gain characteristic 27 represents a major improvement in broadband amplifier tubes because it permits constant drive power over the band to produce uniform maximum power output at relatively high efficiency. Heretofore, in order to achieve even less bandwidth it was necessary to increase the signal power at the band edges by as much as 5 to 10 db but with the present hybrid tube the input signal generator, not shown, can be simplified as it need only provide constant power output over the operating band of the tube which is quite easily achieved at the low power levels, i.e., watts to hundreds of watts required to drive the klystron section 15.

The composite gain characteristic for the prior art hybrid tube is shown as curve 28 on FIG. 2 as derived from the aforementioned I.R.E. article. From the curve 28 it is readily ascertained that the 1 db bandwidth of the gain characteristic for this prior art tube is approximately ½% which is extremely narrow band and greatly inferior in performance to that obtained by conventional traveling wave tube amplifiers of the type described in the aforementioned applications, U.S. Serial Nos. 7,481; 536,597; and 56,415, which latter tubes commonly achieve uniform gain bandwidths of 3% between 1 db points. It should be noted that the gain characteristic for the prior art traveling wave tube section of the hybrid tube had a decreasing response with increasing frequency as shown by curve 29. The cavities of the klystron buncher section must have been of high Q as of 1000 and/or improperly tuned as the composite gain characteristic was not improved over the gain characteristic for the traveling wave circuit portion taken alone.

Figure 3:
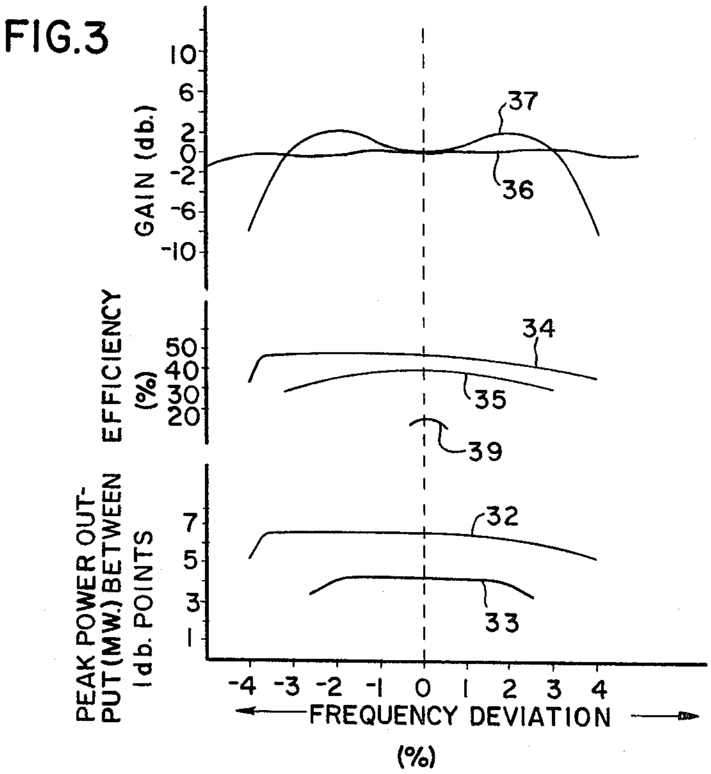
FIG. 3 is a graph of peak power output in megawatts, efficiency in percent, and gain deviation in db all versus frequency deviation about the center frequency for the hybrid tube apparatus of the present invention as contrasted with the same characteristics for prior art tubes.

Referring now to FIG. 3 there is shown a graph of peak power output, efficiency, and gain deviation versus frequency deviation for the hybrid tube apparatus of the present invention as contrasted with broadband traveling wave tubes of the prior art. The hybrid tube of the present invention provides 6.8 megawatts of peak power between 1 db points over a band of frequencies of 8% as shown by curve 32. A traveling wave tube utilizing two severed sections of cloverleaf slow wave circuit with a single triple tuned klystron cavity input provides 5% bandwidth between −1 db points with a peak power output of 4.1 megawatts as shown in curve 33. This last mentioned prior art tube is described in U.S. patent application Serial No. 314,465, filed October 7, 1963.

The present tube also provides improved uniform efficiency over a relatively wide band. For example, curve 34 of FIG. 3 for the tube of FIG. 1 shows maximum efficiency of 48% with uniform efficiency between 1 db points over a band of 8%. The best prior art efficiency was obtained by the aforementioned tube of Serial No. 314,465 and corresponded to curve 35 which provided approximately 5% bandwidth between 1 db points in efficiency with maximum efficiency of approximately 40%. The present invention represents an enhancement of 3% bandwidth and 7% efficiency. The aforementioned prior art hydbrid tube had a maximum efficiency of only 17% as indicated at curve 39.

The gain deviation characteristic of the present invention is again shown in FIG. 3 at line 36 depicting the uniform gain characteristics over a band of 10%. This gain is to be contrasted with the gain characteristic curve 37 for a traveling wave tube utilizing two severed cloverleaf sections which shows that the uniform gain characteristics between 1 db points include less than 3% of band.

In operation, a beam is formed in the electron gun 1 and projected longitudinally of the tube through the anode 6, klystron driver section 15, traveling wave tube section 16 and collected in the collector 3. Signal energy to be amplified is fed into the first cavity 16 via a coaxial input line 41 and input loop 42. The signal energy applied to cavity 16 velocity modulates the beam which is transformed into current density modulation of the beam after passage through the first drift tube section 43. Successive cavities 18, 19 and 20 serve to further velocity modulate the beam in the conventional klystron manner to amplify the current density modulation of the beam after passage through the successive drift tube sections 44. After leaving the last drift tube section 44 the current density modulated beam with the signal energy impressed thereon enters the input end of the traveling wave tube section. In a preferred embodiment the distance L from the center of the gap of the last driver cavity 20 to the center of the first cloverleaf section 21 is made as short as possible, however, the operating data for the tube of FIG. 1 was obtained with an $L=38$ degrees of reduced plasma wavelength of the beam.

The current density modulated beam excites a signal on the slow wave circuit 16. The signal on the circuit moves in the forward direction in synchronism with the current density modulation of the electron beam to produce a growing wave on the slow wave circuit 16. The signal is extracted from the slow wave circuit 16 at the terminal end thereof and fed via waveguide impedance transformer section 45 and flared waveguide section 46 to an output window assembly 47. The output window assembly 47 includes a wave permeable window member 48 as of alumina ceramic sealed across the output waveguide section in a vacuum tight manner to permit passage of the wave energy therethrough while maintaining a vacuum in the tube apparatus. The output window is of the conventional design as described in U. S. Patent 2,958,834, issued November 1, 1960, inventor Robert S. Symons et al. After passage through the window assembly 47 the wave energy is propagated to a load, not shown.

An R.F. termination section 50 is provided at the input end of the traveling wave tube section 16 for dissipating wave energy on the traveling wave tube circuit traveling in the backward direction such wave energy often being produced by reflections at the terminal end of the traveling wave tube section 16. The terminating section 50 is a half height section of the cloverleaf structure provided with lossy dielectric members 51 disposed on the noses of the inwardly directed side wall projections of the cloverleaf circuit, as indicated in phantom lines at FIG. 4. The lossy terminating section 50 is capable of dissipating 500 watts average power to prevent undesired oscillation in the output traveling wave tube section 16.

In addition, the interior surfaces of all but the last six sections 21 of the cloverleaf traveling wave tube section 16 are coated with a lossy material such as, for example, Kanthal alloy A comprising 5% aluminum, 22% chromium, 0.5% cobalt and the balance iron. The lossy coating is flame sprayed over the interior surfaces of the slow wave circuit 16 to a depth of approximately 0.005". In addition mode suppression elements 52 are provided in alternate sections 21 of the cloverleaf structure to suppress band edge oscillations. These mode supressors 52 form the subject matter of and are claimed in copending application Serial No. 346,495 filed Feb. 21, 1964 and assigned to the same assignee as the present invention. Briefly they are 0.050" diameter copper wires sprayed with Kanthal alloy A and bent into hairpin like shapes and brazed into the cloverleaf section 21, as shown. In a preferred embodiment the lossy mode suppressors 52 are disposed in substantial longitudinal alignment taken in the direction of the longitudinal axis of the tube. In addition the planes of the loops 52 are parallel to the longitudinal axis of the tube. In a preferred embodiment the radial extent of the loop is varied in each of the sections 21 to thereby tune the resonant frequency of the loop to slightly different frequencies in successive sections 21. The lossy resonant loops 52 have their resonant frequencies tuned to overlap the frequency where band edge oscillations are expected.

In a typical S-band tube of the present invention (see FIG. 5) the upper end of the passband of the tube was at 2900 megacycles and the band edge oscillations were observed to occur at 3020 megacycles without provision of the mode suppressors 52. The mode suppressors 52 were tuned to blanket the frequency of the band edge oscillations and in particular the radial extent of the loops were 1¼", 1⅜", 1½", 1⅓", and 1¼". With the mode suppressors 52 the band edge oscillations were completely suppressed.

Band edge oscillations are seen to occur at frequencies corresponding to the $\pi$ mode for the traveling wave tube circuit (see FIG. 6). With the mode suppression devices 52 and techniques used in the present invention the beam voltage can be set to a voltage 53 corresponding to the $\pi$ mode of oscillation of the traveling wave tube section 16 without observing band edge oscillations. Band edge oscillations are highly undesired because they produce an identifying signal at a fixed frequency each time a signal is amplified by the tube. When the tube is utilized in a frequency agile radar this band edge oscillation serves to provide an undesired identifying signal which can be used to identify the radar because the identifying band edge signal always occurs at the same frequency near the normal output signal of the radar. The power in the band edge oscillating signal can be quite substantial, for example, in the order of ½ to ⅓ the peak power output on the main pulse of the tube and therefore is to be avoided if possible.

The present invention is also applicable to hybrid tubes wherein the traveling wave tube section 16 has a gain characteristic differing from that obtained from the cloverleaf tube circuit. For example, an alternative slow wave circuit is the long slot coupled circuit described in Stanford University Microwave Laboratory, W. W. Hansen Laboratory of Physics, 1st and 2nd Annual Report for period July 1958 to June 1960 titled "Development of High Power Broadband Tubes and Related Studies" under Air Force contract AF 301(602)-1844 published January 1961 at pages 93–124. In this type of circuit the gain characteristic for the traveling wave tube section is one wherein the gain decreases with increasing frequency across the passband of the circuit somewhat similar to curve 29. In such a device the klystron driver section 15 would be tuned and arranged such that its gain characteristic provided an increasing gain with increasing frequency across the passband of the tube. In this manner the gain of the klystron section would supplement the gain of the traveling wave tube section to provide uniform gain over the passband of the tube. In this latter example the first or upstream cavity resonator 17 would be turned further toward the low end of the passband of the tube than as shown in FIG. 2 and the remaining cavities would be tuned to the high frequency end of the band.

Further detail structure of the main tube body 5 is that the anode 6 includes an outer annular ring member 61 as of copper sealed at its periphery as by brazing to an envelope segment 62 as of iron of the electron gun 1. Sealed within the central interior of the ring member 61 is a flared throat member in axial alignment with the beam path to converge the beam drawn from the gun therethrough. Throat member 63 as of copper is provided with an annular hollow passage 64 therein for the passage of coolant therethrough for cooling of the anode 6 in use.

A magnetic cathode pole piece 72 surrounds the anode and is provided with a magnetic adaptor ring 73 serving as one pole piece of a magnetic beam focusing solenoid 86. The adaptor ring 73 is fixedly secured to the magnetic pole piece 72 as by screws, not shown.

A collector pole piece 74 is provided at the collector end of the main tube body 5 and similarly forms the collector pole piece of the beam focus solenoid. The collector pole piece is centrally apertured for the passage of the beam therethrough and serves to collect the beam focusing magnetic field after its passage from the anode pole piece through the main tube body to the collector pole piece 74 and to return the magnetic flux to the solenoid 86.

The klystron driver section 15 is strengthened by the provision of four longitudinally directed quadraturely spaced rods 75 as of non-magnetic stainless steel connected at one end to the anode pole piece 72 and connected at the other end to a plate 76 as of stainless steel affixed to the upstream end of the slow wave section 16. A plurality of transverse plates 77 as of stainless steel interconnect the rods 75 and the drift tube members 43 and 44 to provide rigidity to the klystron buncher structure 15.

A copper plate 78 surrounds the lossy load terminating cloverleaf section 50 of the traveling wave tube section 16 for carrying the heat away from the load. A cooling pipe 81 surrounds the plate and coolant is circulated through the pipe 81 for carrying away the heat. A stainless steel tube 82 is vacuum sealed at one end to the plate 78 and forms the vacuum envelope for the slow wave circuit section 16. The tube 82 is sealed at the other end to a similar end plate 83 as of copper. The end plate 83 has the output terminal for the slow wave circuit 16 and the transformer 45 formed therein. A getter-ion vacuum pump 84 is disposed in gas communication via tubulation 85 with the interior of the tube for maintaining a low vacuum pressure as of $10^{-9}$ mm. Hg within the vacuum envelope of the tube.

Since many changes can be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A hybrid microwave tube apparatus including; means for forming a stream of electrons; means disposed along said stream for electromagnetic interaction with said beam; said interacting means including, a traveling wave circuit disposed along said stream path for cumulative interaction between the stream and a wave of increasing amplitude moving on said wave circuit; output terminal means for extracting wave energy from said stream for transmission to a utilization device; said interacting means also including a plurality of resonators spatially separated along said stream path upstream of said wave circuit and forming a buncher section for current density modulating said stream before interaction with said wave circuit, said resonators being dimensioned and tuned to provide a signal gain characteristic for the buncher section which is supplementary to the gain characteristic of said traveling wave section, and wherein certain of said resonators of said buncher section are cavity resonators tuned to different frequencies corresponding to the opposite band edges of the gain characteristic of said traveling wave circuit to thereby peak up the composite gain characteristic of the tube at the band edges, whereby the total gain characteristic for the tube apparatus is rendered more uniform than that obtained from said wave circuit section taken alone.

2. The apparatus according to claim 1 wherein said wave circuit is a forward wave fundamental space harmonic circuit over the passband of the tube.

3. The apparatus according to claim 2 wherein said wave circuit is a cloverleaf negative mutually inductively coupled circuit having a forward wave fundamental mode of operation in the tube.

4. The apparatus according to claim 3 wherein said cloverleaf circuit is coated on its interior surfaces with a lossy substance over a preponderance of its interior surface to present to the circuit distributed loss to prevent undesired oscillations.

5. The apparatus according to claim 1 wherein said resonators are cavity resonators tuned to different frequencies over the passband of the tube and at least three of said cavity resonators have loaded Q's less than 200.

6. The apparatus according to claim 5 wherein said cavity resonator furthest upstream is tuned to the lowest resonant frequency and also has the lowest Q of said cavities.

7. A hybrid microwave tube apparatus including, means for forming and projecting a beam of electrons over an elongated beam path, means at the terminal end of said beam path for collecting and dissipating the energy of said electrons, means disposed intermediate said beam forming means and said beam collecting means along said beam path for electromagnetic interaction with said beam, said interacting means including a traveling wave circuit for cumulative interaction with the beam passable therethrough, said interacting means also including a multicavity klystron buncher section disposed along said beam path upstream of said traveling wave circuit, said traveling wave circuit having a gain characteristic which drops off at certain frequencies, said multicavity driver section having its cavities staggered in resonant frequency such that the gain characteristic of the driver section is peaked up at frequencies corresponding to the drop-off in response of the gain characteristic of said wave circuit and lowered in gain at frequencies corresponding to maximum gain of said traveling wave circuit whereby the total gain characteristic of the tube is rendered more uniform than the gain characteristic of said wave circuit taken alone.

8. The apparatus according to claim 7 wherein said wave circuit operates in the tube in a forward wave fundamental space harmonic and is a negative mutually inductive coupled circuit.

9. The apparatus according to claim 8 wherein said wave circuit is coated on its interior surface over a preponderance of the interior surface with a lossy material to suppress undesired oscillations.

10. The apparatus according to claim 8 wherein said negative mutually inductively coupled wave circuit is a cloverleaf circuit.

11. The apparatus according to claim 10 wherein said multiple cavity driver section includes at least three cavity resonators with the cavity resonator which is disposed furthest upstream being tuned to the lowest frequency and having the lowest loaded Q of the remaining cavities and at least two of said other cavities being tuned to the high frequency end of the passband of the tube whereby a uniform gain characteristic is obtained over a wide band of frequencies.

12. The apparatus according to claim 3 wherein said buncher section of said interacting means includes at least three cavity resonators spatially separated along said beam path, said cavity resonators all having a loaded beam Q less than 200, and the cavity resonator disposed furthest upstream of said beam having said input terminal therein for applying input signals to said first resonator, and said first resonator being tuned to the lowest frequency of said resonators and having the lowest loaded Q of said resonators.

13. The apparatus according to claim 12 wherein at least two other ones of said klystron driver cavities are tuned to resonant frequencies near the high frequency end of the passband of the tube, and wherein a preponderance of the interior surfaces of said cloverleaf circuit are coated with a lossy material to prevent undesired oscillations in said cloverleaf circuit.

References Cited by the Examiner

UNITED STATES PATENTS

| | | | |
|---|---|---|---|
| 2,952,795 | 9/1960 | Craig et al. | 315—39.3 X |
| 3,195,007 | 7/1965 | Watson et al. | 315—5.45 |

FOREIGN PATENTS

| | | |
|---|---|---|
| 1,003,492 | 11/1951 | France. |
| 1,143,166 | 4/1957 | France. |

HERMAN KARL SAALBACH, *Primary Examiner.*

ELI LIEBERMAN, S. CHATMON, Jr., *Assistant Examiners.*